United States Patent
Kumar et al.

(10) Patent No.: US 7,583,073 B2
(45) Date of Patent: Sep. 1, 2009

(54) CORE-LESS CURRENT SENSOR

(75) Inventors: Sachin Kumar, Freeport, IL (US); Raviprakash Thotadakumbri, Bangalore (IN); Gangi Rajula Reddy, Bangalore (IN)

(73) Assignee: Honeywell International Inc., Morristown, NJ (US)

( * ) Notice: Subject to any disclaimer, the term of this patent is extended or adjusted under 35 U.S.C. 154(b) by 224 days.

(21) Appl. No.: 11/780,163

(22) Filed: Jul. 19, 2007

(65) Prior Publication Data

US 2009/0021249 A1 Jan. 22, 2009

(51) Int. Cl.
*G01R 33/00* (2006.01)

(52) U.S. Cl. .................................. 324/117 R
(58) Field of Classification Search .......... 324/126, 324/127, 117 H, 117 R, 158.1, 765; 257/48; 338/32 H; 327/511
See application file for complete search history.

(56) References Cited

U.S. PATENT DOCUMENTS

| | | | |
|---|---|---|---|
| 4,331,896 A | 5/1982 | Sedgewick | 310/179 |
| 4,520,300 A | 5/1985 | Fradella | 318/603 |
| 4,525,665 A | 6/1985 | Smalley | 324/52 |
| 5,041,780 A | 8/1991 | Rippel | 324/117 H |
| 5,508,618 A | 4/1996 | Owens | 324/402 |
| 5,642,041 A * | 6/1997 | Berkcan | 324/127 |
| 5,717,326 A | 2/1998 | Moriwaki | 324/117 H |
| 6,512,359 B1 * | 1/2003 | Tamai et al. | 324/117 R |
| 6,710,587 B1 * | 3/2004 | Reynoso et al. | 324/117 R |
| 6,965,225 B2 | 11/2005 | De Buda | 324/117 |
| 2002/0079903 A1 | 6/2002 | Smith et al. | 324/536 |
| 2002/0079906 A1 | 6/2002 | Rashkes et al. | 324/544 |
| 2006/0082357 A1 | 4/2006 | Tsukamoto | 324/126 |

FOREIGN PATENT DOCUMENTS

| | | |
|---|---|---|
| EP | 0 548 362 A1 | 6/1993 |
| EP | 0 548 362 B1 | 9/1997 |
| JP | 07020158 A1 | 1/1995 |
| JP | 22286763 A2 | 10/2002 |
| JP | 24061217 A2 | 2/2004 |
| JP | 25278296 A2 | 10/2005 |
| JP | 26038640 A2 | 2/2006 |
| JP | 26058120 A2 | 3/2006 |
| WO | WO 89/09417 | 10/1989 |
| WO | WO 2006/047922 A1 | 5/2006 |

* cited by examiner

*Primary Examiner*—Ha Tran T Nguyen
*Assistant Examiner*—Tung X Nguyen
(74) *Attorney, Agent, or Firm*—Luis M. Ortiz; Kermit D. Lopez

(57) ABSTRACT

Core-less current sensor comprises two parallel conductors carrying equal currents in the same direction. The magnetic field in mid location of the two parallel conductors carrying equal currents in the same direction for all current magnitudes is zero in absence of an external magnetic interference. Sum of magnetic fields in two points equidistant from the mid location on both the sides is zero as magnetic fields at these points are equal in magnitude and opposite in polarity for all current magnitudes and for equal amount of currents flowing through both conductors in same direction in absence of an external magnetic interference. Two sensing elements can be arranged between the two parallel conductors for sensing the magnetic field due to currents flowing through them for the purpose of current measurement. Sensor output is the difference between two outputs measured by the sensing elements. Outputs of sensing elements can vary due to external interference. As variation in the outputs of sensing elements due to external interference gets cancelled in sensor output, automatic external field compensation can be achieved.

20 Claims, 7 Drawing Sheets

CORE-LESS CURRENT SENSOR

TECHNICAL FIELD

Embodiments are generally related to current sensors based on magnetic field sensing techniques such as for e.g. Hall Effect, Magneto-resistive (Anisotropic Magneto-resistive, Giant Magneto-resistive, etc.) sensing etc. Embodiments are also related to the field of core-less current sensors. Embodiments are additionally related to core-less current sensors with automatic external magnetic interference protection.

BACKGROUND OF THE INVENTION

A variety of current measurement techniques are known, including resistive shunt, current transformer, Hall Effect based sensors and Magneto-resistive (MR) sensors. The shunt measurement technique works on the principle of Ohm's Law, while current transformer and Hall Effect based sensors utilize Ampere's Law. Each technology has its own tradeoffs. Shunts offer low cost, DC (Direct Current) and AC (Alternating Current) current sensing but insert a voltage drop and do not provide isolation. Current transformers are of low cost and additionally provide isolation, but only work for ac current. Hall Effect based sensors, both open and closed loop technology, provide isolation and DC to high frequency (200 kHz) AC operation, but have limitations in cost, size, linearity and temperature performance. The Magneto Resistive (MR) sensor uses a magneto resistor, which is a two-terminal device that changes its resistance with a change in magnetic field.

Presently, current sensor uses a magnetic field transducer (for example a Hall effect or Magneto Resistive (MR) transducer) in proximity to a current conductor. The magnetic field transducer generates an output signal having a magnitude proportional to the magnetic field induced by a current that flows through the current conductor. Some typical Hall Effect current sensors include a gapped toroid magnetic flux concentrator, with the Hall Effect element positioned in the toroid gap. The Hall Effect device and toroid are assembled into a housing, which is mountable on a printed circuit board. In use, a separate current conductor, such as a wire, is passed through the center of the toroid. Such devices tend to be undesirably large, in terms of height, weight and circuit board area.

Also known is that closed loop current sensors are based on the principles of Magneto-resistive technology and the null balance or zero magnetic flux method (feedback system). The magnetic flux in the sensor core is constantly controlled at zero. The amount of current required to balance zero flux is the measure of primary current flowing through the conductor. These sensors are used primarily for motor control applications and power electronics. The sensor generally utilizes an application-specific integrated circuit (ASIC) technology to exploit high performance for MR sensor. The sensor uses a magnetic core to concentrate the measured magnetic field around the primary conductor which protects the sensor from external magnetic interferences making it more accurate and reliable.

Besides providing accuracy and reliability core sensors have inherent demerits. Increased sensor weight and size, sluggish time response at higher frequencies and nonlinear permeability variation with frequency that can affect the output accuracy are some of the drawbacks of using current core sensors. Further the core saturation at higher currents, magnetic remanence (offset) and it's variation with current magnitude and temperature dependency of core magnetic properties can affect output accuracy. Furthermore, a sensor with core turns out to be more expansive due to material and assembly cost which is usually around 20% of product cost. As highly sensitivity magnetic sensors (MR, Hall etc.) are currently available, field concentration may not be required; however the usage of a core is still preferred by designers for the sensor's reliable operation under external magnetic interferences, and designers work around it's demerits to minimize them to suit an application requirement. An Ideal market demand and also a designer's dream is to have a current sensor which is core-less and also have protection from external magnetic interferences.

It is also known that a core-less current sensor comprising a U-type of parallel conductors with opposite direction currents is available in closed loop configuration. The primary current can be fed through a U-shaped conductor for creating a field gradient between the two sides of the conductor. Thin film MR resistors can be placed on a silicon chip and can be connected in a Wheatstone bridge. The chip can be mounted together with analogue interface electronics on a single in-line hybrid circuit. Compensation current can be fed back to the sensor chip through a compensation conductor located above MR resistor. The resulting field exactly compensates the field gradient so that the sensor always works around a single point. At the output of the sensors, the compensation current flows through a measurement resistor resulting in an output voltage.

In another known core-less current sensor technology, a precision, low-offset linear Hall sensor circuit with a copper conduction path located near the die is used. Current flowing through the copper conduction path generates a magnetic field which can be sensed by the integrated Hall (integrated Circuit) IC and converted into a proportional voltage. Device accuracy is optimized through the close proximity of the magnetic signal to the Hall transducer. In yet another core-less current sensor, a single-axis integrated magnetic field sensor based on the Hall Effect is used. The circuit can be fabricated using a conventional Complementary metal-oxide-semiconductor (CMOS) technology with an additional ferromagnetic layer. The ferromagnetic layer can be used as a magnetic flux concentrator providing a high magnetic gain.

The existing core-less current sensors are not immune from external interferences; therefore, a need exists for a core-less sensor that is immune from external magnetic interferences. Furthermore, the core-less sensor is preferred over a sensor utilizing core as it does not have the limitations on time response, frequency response, and have no magnetic remanence (offset), no saturation and non linearity issues. As will be shown with the foregoing invention, the present inventors have discovered that it is possible to achieve a low cost, light weight and small size core-less current sensor which is immune to external magnetic interferences.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide an improved current sensor based on magnetic sensing technique such as Hall Effect and Magneto-resistive (e.g., Anisotropic Magneto-resistive, Giant Magneto-resistive etc.) sensors, etc.

It is another aspect of the present invention to provide for a core-less current sensor based on magnetic sensing technique such as Hall Effect and Magneto-resistive (e.g., Anisotropic Magneto-resistive, Giant Magneto-resistive etc.) sensors, etc.

It is a further aspect of the present invention to provide for a core-less current sensor based on magnetic sensing technique (as mentioned above) with external magnetic interference protection.

The aforementioned aspects and other objectives and advantages can now be achieved as described herein. A coreless current sensor comprises of two parallel conductors carrying equal currents in the same direction. The magnetic field in the mid location of the two parallel conductors carrying equal currents in the same direction for all current magnitudes is always zero in absence of external magnetic interferences as magnetic field due to both conductors cancel each other being equal and opposite in nature. Also the sum of magnetic fields in two different locations located equidistant and in both sides from mid location of both conductors is always zero for all current magnitudes flowing through these two parallel conductors carrying equal currents in same direction in absence of an external magnetic interference. Two sensing elements are arranged sufficiently closer between the two parallel conductors for sensing the magnetic field generated by current through conductors. The sensor output is the difference between two outputs measured by the sensing elements. The outputs of sensing elements can vary at the same time due to external interference. The variation in the outputs due to external interference gets cancelled in sensor output and thus automatic external field compensation can be achieved.

In accordance with another feature of the present invention, one of the sensing elements is located at a middle point between the two parallel conductors carrying currents in same direction and other anywhere between the middle and either of the conductors. The magnetic field is always zero in the middle point of two conductors for all current magnitudes in absence of an external magnetic interference as mentioned above in [0013].

In yet another feature of the present invention, the sensor elements can be located equidistant from the center line on both the sides. In absence of an external magnetic interference, sum of magnetic fields at these two locations is zero and becomes non-zero in presence of it.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

Figure 1:
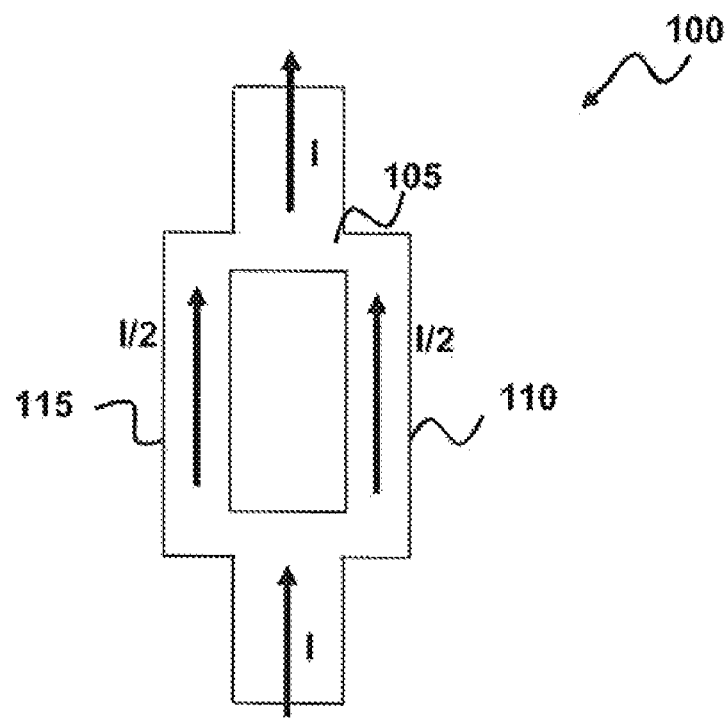
FIG. 1 illustrates an explanatory diagram of a core-less current sensor, which can be implemented in accordance with a preferred embodiment.

FIG. 1 illustrates an explanatory diagram of a core-less current sensor 100, which can be implemented in accordance with a preferred embodiment. The current I can be passed through a pair of parallel conductors 105. The current I divide equally between the conductors 110 and 115 and each conductor carries an equal current I/2. The size of conductors 110 and 115 can be determined based on the permissible current density for conducting material like copper, aluminum, etc. For example, a copper conductor with a cross sectional area of 4 mm$^2$ should be fine for currents up to 25 A.

The conductors 110 and 115 can be traced out on a PCB (Printed Circuit Board) up to certain current ratings. Ratings can be determined based on the current density. The current density is given by:

Current Density=$(I/2)/(A/2)=I/A$, where I/2 and A/2 represents the current and cross-sectional area of the conductor 110 or 115 respectively.

Figure 2:
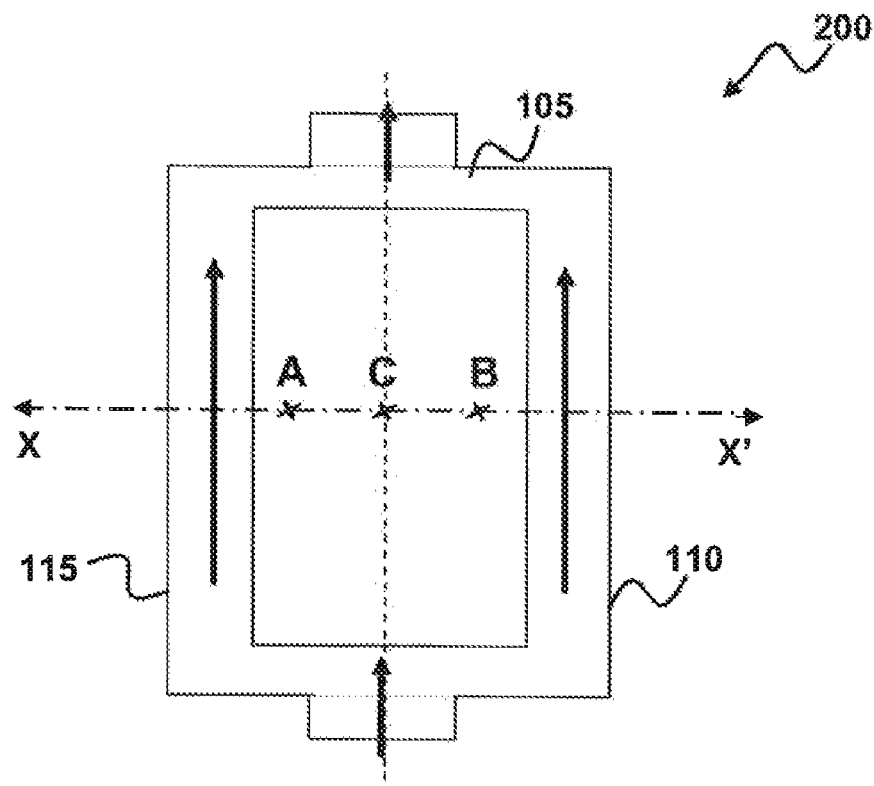
FIG. 2 illustrates an explanatory diagram of a core-less current sensor depicting the points for placing the sensing elements, which can be implemented in accordance with a preferred embodiment.

FIG. 2 illustrates an explanatory diagram 200 of a core-less current sensor depicting the points for placing the sensing elements, which can be implemented in accordance with a preferred embodiment. Note that in FIGS. 1-2, identical or similar parts or elements are indicated by identical reference numerals. Thus, FIG. 2 also contains a pair of parallel conductors 105 and the conductors 110 and 115. The points A, B and C represent the locations of sensor element for sensing the current through the pair of parallel conductors 105. The point C represents the middle point between the conductor 110 and 115. The point A represents a location anywhere between middle point C and conductor 115 and the point B represents a location anywhere between middle point C and the conductor 110 depending upon different design constraints and performance requirements. The magnetic field is always zero in the middle point C of conductors 105 and 115 carrying current in same direction for all current magnitudes in absence of an external magnetic interference.

Figure 3A:
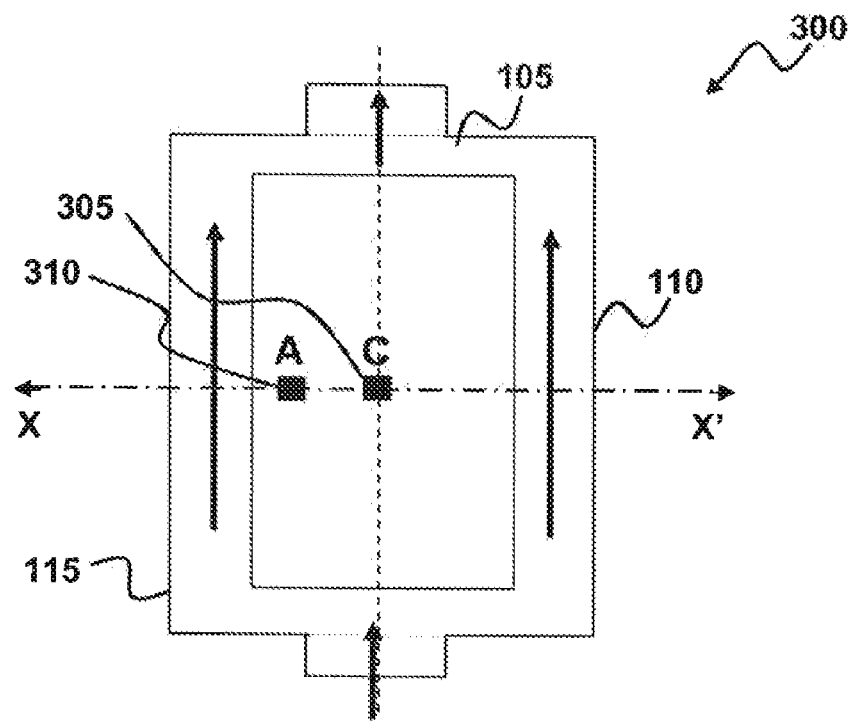
FIG. 3A illustrates an explanatory diagram of a core-less current sensor depicting the arrangement of the sensing elements, in accordance with a preferred embodiment.

FIG. 3A illustrates an explanatory diagram 300 of a coreless current sensor depicting the arrangement of the sensor elements, in accordance with a preferred embodiment. Note that in FIGS. 1-3A, identical or similar parts or elements are indicated by identical reference numerals. Thus, FIG. 3A also contains a pair of parallel conductors 105 and the conductors 110 and 115. The sensing elements 305 and 310 are arranged at the points A and C respectively. The sensor output is the measure of difference of outputs of two sensing elements 305 and 310. In normal condition, the output of sensing element 305 at C is always zero even if the current magnitude varies. Any external interference can be seen by both the sensing elements 305 and 310 and get cancelled in the sensor output.

The sensor output, in normal condition and sensor output in interference condition are given by the following equations (1), (2) and (3) respectively.

$$\text{Output}=X-Y \tag{1}$$

$$\text{Output } X-0=X \tag{2}$$

$$\text{Output}=(X+/-\Delta)-(Y+/-\Delta)=X+/-\Delta-0-/+\Delta=X, \tag{3}$$

Where X represent the sensor element 310 output at point A, Y represent the sensor element 305 output at point C and $\Delta$ represents the change in output due to external magnetic interference.

Figure 3B:
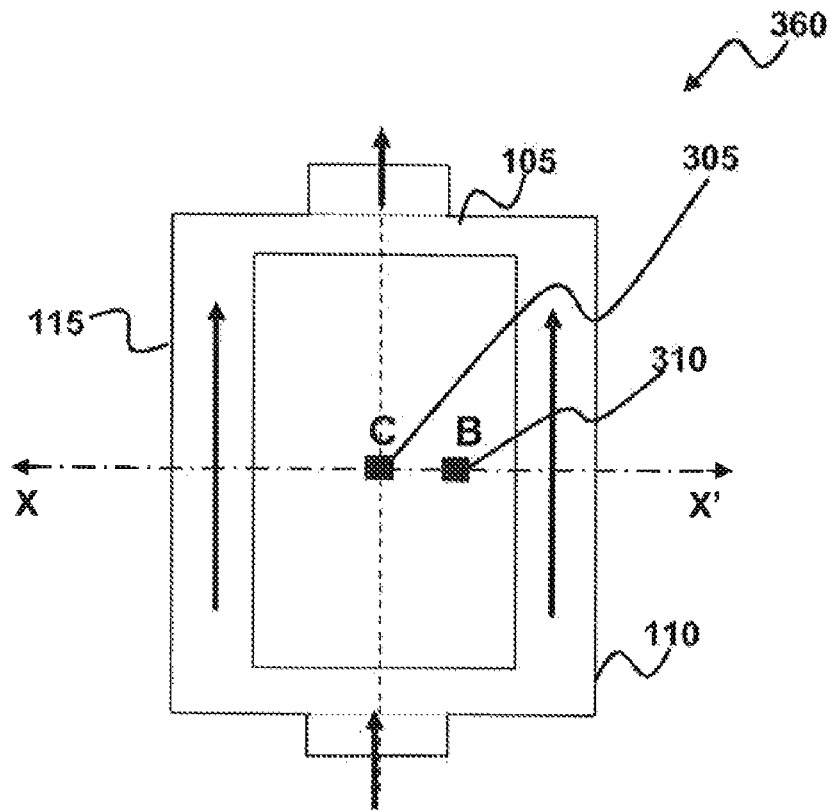
FIG. 3B illustrates an explanatory diagram of a core-less current sensor depicting another arrangement of the sensing elements, in accordance with a preferred embodiment.

FIG. 3B illustrates an explanatory diagram 360 of a core-less current sensor depicting the arrangement of the sensor elements, in accordance with a preferred embodiment. Note that in FIGS. 1-3B, identical or similar parts or elements are indicated by identical reference numerals. Thus, FIG. 3B also contains a pair of parallel conductors 105, the conductors 110 and 115 and the sensor elements 305 and 310. The sensing elements 305 and 310 are arranged at the points B and C respectively. The sensor output is the measure of difference of outputs of two sensing elements 305 and 310. In normal condition, the output of sensing element 305 at C is always zero even if the current magnitude varies. Any external interference can be seen by both the sensing elements 305 and 310 and get cancelled in the sensor output.

The sensor output in normal and interference condition are given by the following equations (4) and (5) respectively.

$$\text{Output}=Z-0=Z \tag{4}$$

$$\text{Output}=(Z+/-\Delta)-(Y+/-\Delta)=Z+/-\Delta-0-/+\Delta=Z, \tag{5}$$

Where Z represents the output of sensor element 310 at point B, Y represents the output of sensor element 305 at point C and $\Delta$ represents the change in output due to external magnetic interference.

Figure 4:
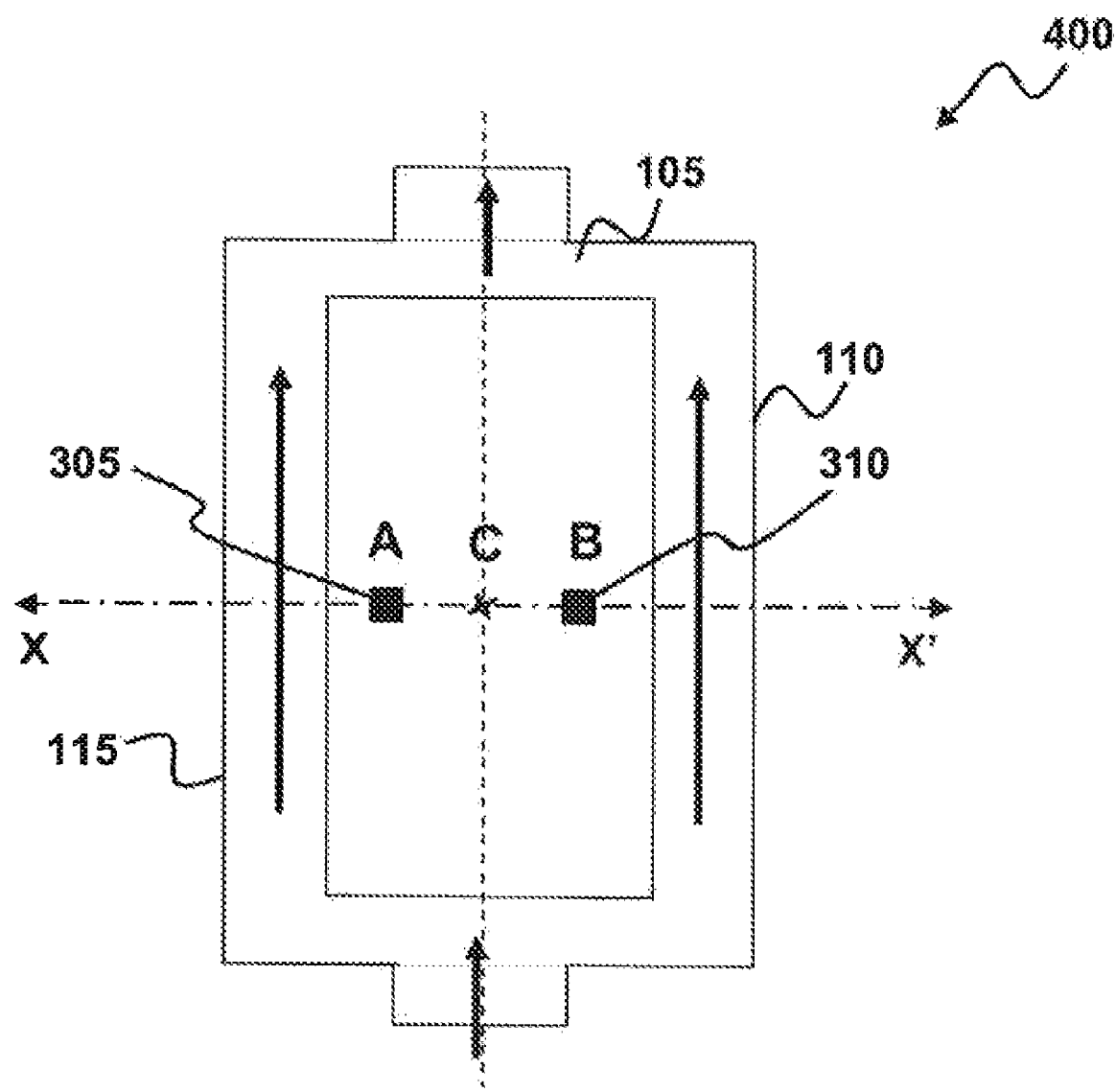
FIG. 4 illustrates an explanatory diagram of a core-less current sensor depicting the arrangement of the sensing elements, in accordance with an alternate embodiment.

FIG. 4 illustrates an explanatory diagram 400 of a core-less current sensor depicting the arrangement of the sensor elements, in accordance with an alternate embodiment. Note that in FIGS. 1-4, identical or similar parts or elements are indicated by identical reference numerals. Thus, FIG. 4 also contains a pair of parallel conductors 105, the conductors 110 and 115 and the sensor elements 305 and 310. The sensing elements 305 and 310 are arranged at the points A and B respectively which are located equidistant from center point C on both the sides anywhere between two parallel conductors depending upon different design constraints and performance requirements. The sensor output is the difference of outputs of two sensing elements 305 and 310 located at point A and point B respectively. Any external interference can be seen by both the sensing elements 305 and 310 and get cancelled in the sensor output.

Figure 5:
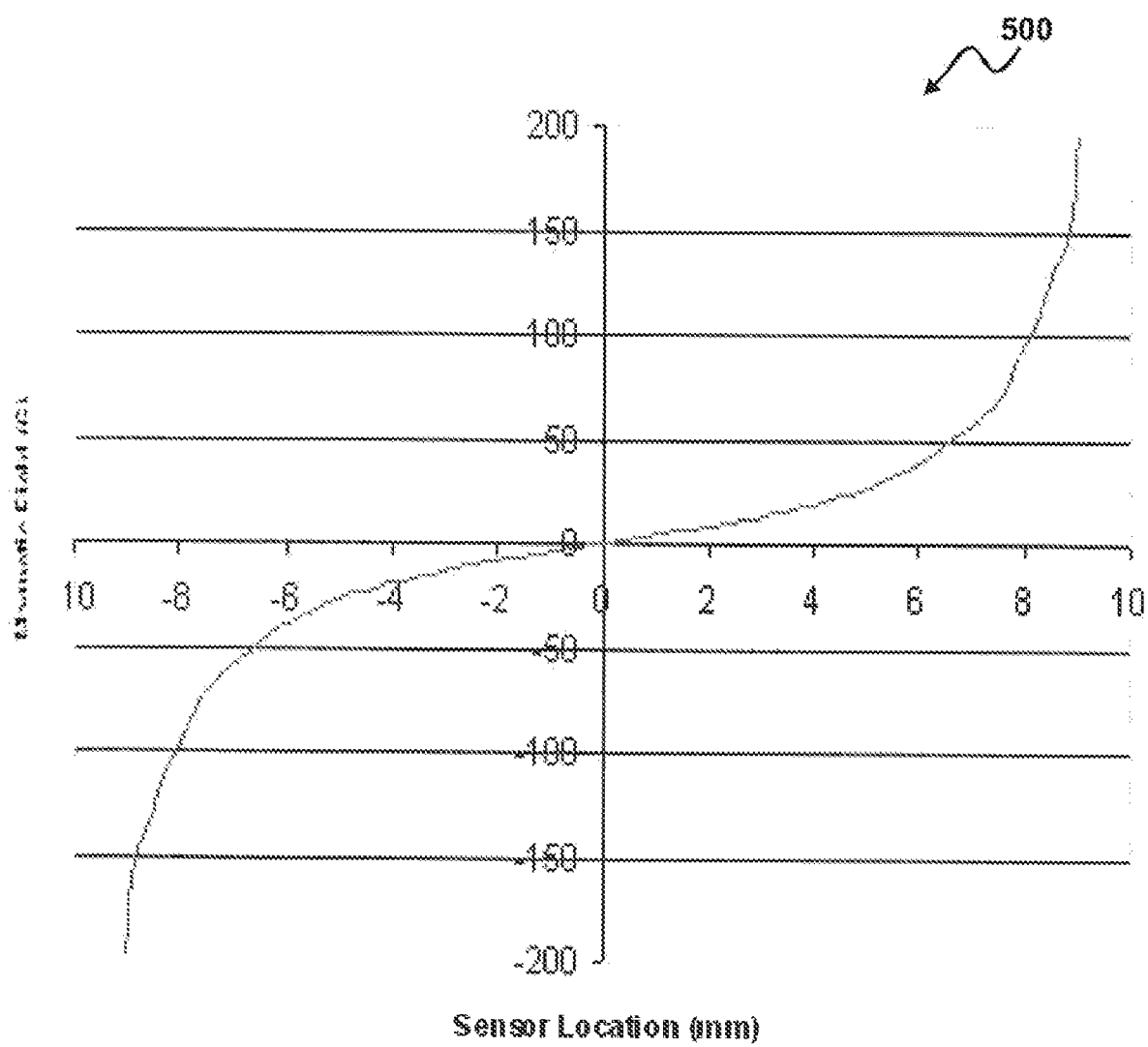
FIG. 5 illustrates a graph of a core-less current sensor showing a magnetic field profile between two parallel conductors carrying current in same direction.

As indicated in FIG. 5, outputs of A and B sensing elements is equal in magnitude and opposite in sign in normal conditions. The sensor output in normal and interference condition are given by the following equations (6) and (7) respectively;

$$\text{Output}=(Y-Z)/2, \tag{6}$$

$$\text{Output}=(Y+/Y--Z-/Z+)/2=(Y-Z)/2, \tag{7}$$

where $(Y+)-Y=(Z-)-Z=\Delta$, and where Y represents the output of sensor element 305 at A, Z represents the output of sensor element 310 at point B and $\Delta$ represents the change in output due to external magnetic interference. In normal and interference condition the value of Y+Z is zero and nonzero respectively.

FIG. 5 illustrates a graph 500 of a core-less current sensor showing a magnetic field profile between conductors 110 and 115 depicted in FIG. 1 carrying current in same direction, in accordance with a preferred embodiment.

Figure 6:
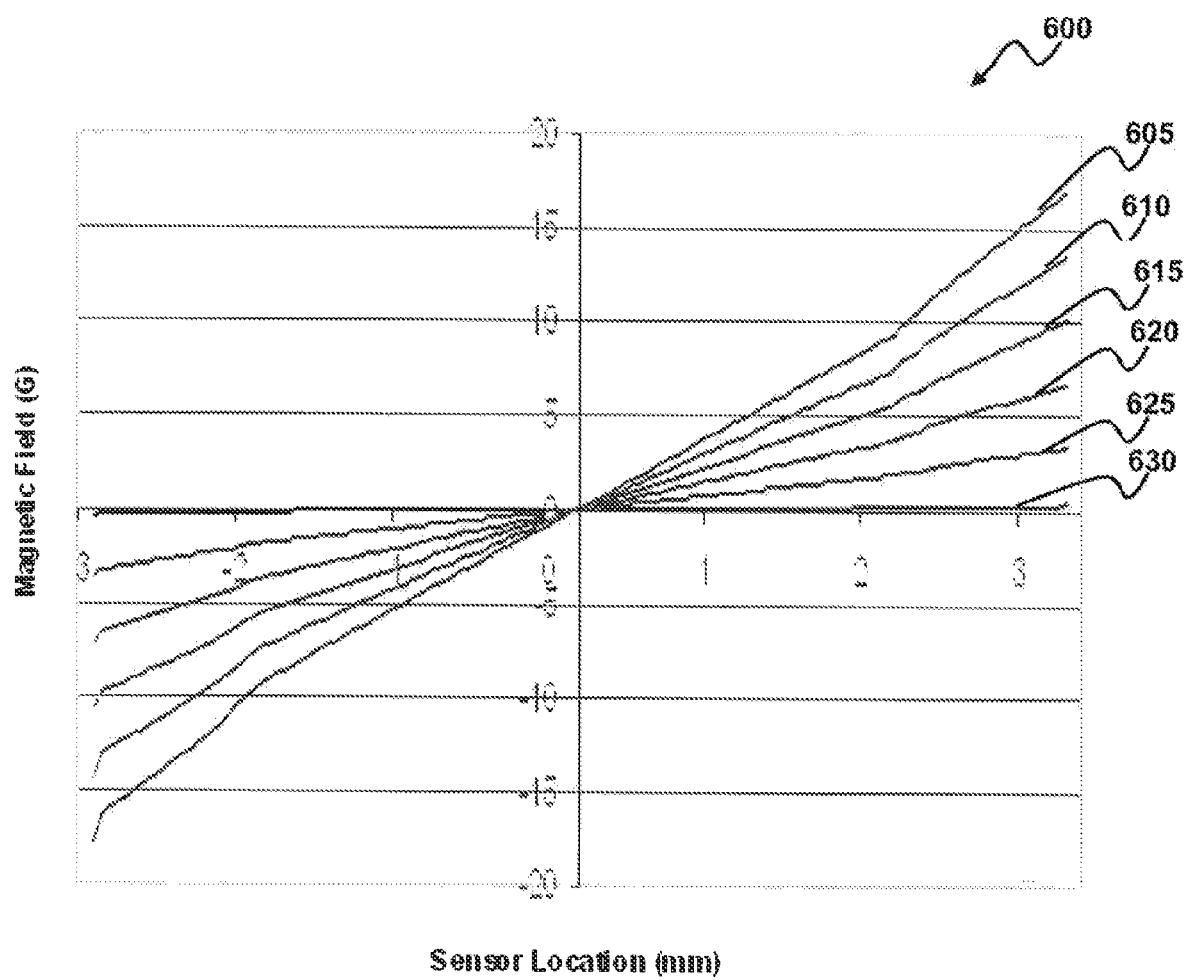
FIG. 6 illustrates a graph of a particular 0-25 A core-less current sensor showing a magnetic field profile between two parallel conductors carrying current in same direction.

FIG. 6 illustrates a graph 600 of 0-25 A core-less current sensor showing a magnetic field profile between conductors 110 and 115 depicted in FIG. 1 carrying current in same direction, in accordance with a preferred embodiment. FIG. 6 illustrates the magnetic profiles 605, 610, 615, 620, 625 and 830 of the current ranges 25 A, 20 A, 15 A, 10 A, 5 A and 0.5 A respectively, when parallel plate conductors are located around 6 mm apart.

The invention can be used for both open-loop as well as close-loop configurations using different magnetic sensing techniques such as Hall Effect and Magneto-resistive (e.g., Anisotropic Magneto-resistive, Giant Magneto-resistive etc.) sensing, etc., and more particularly in open-loop current sensing utilizing MR/AMR sensors due to flexibility of the measured magnetic field range which is different at different locations between the conductors for same current range. For example, the magnetic field varies from 0 to 18 gauss for a particular 25 A sensor and hence gives a flexibility to choose from a wide variety of MR/AMR (Integrated Circuit) ICs having very smaller ranges to as high as 18 gauss.

Figure 7:
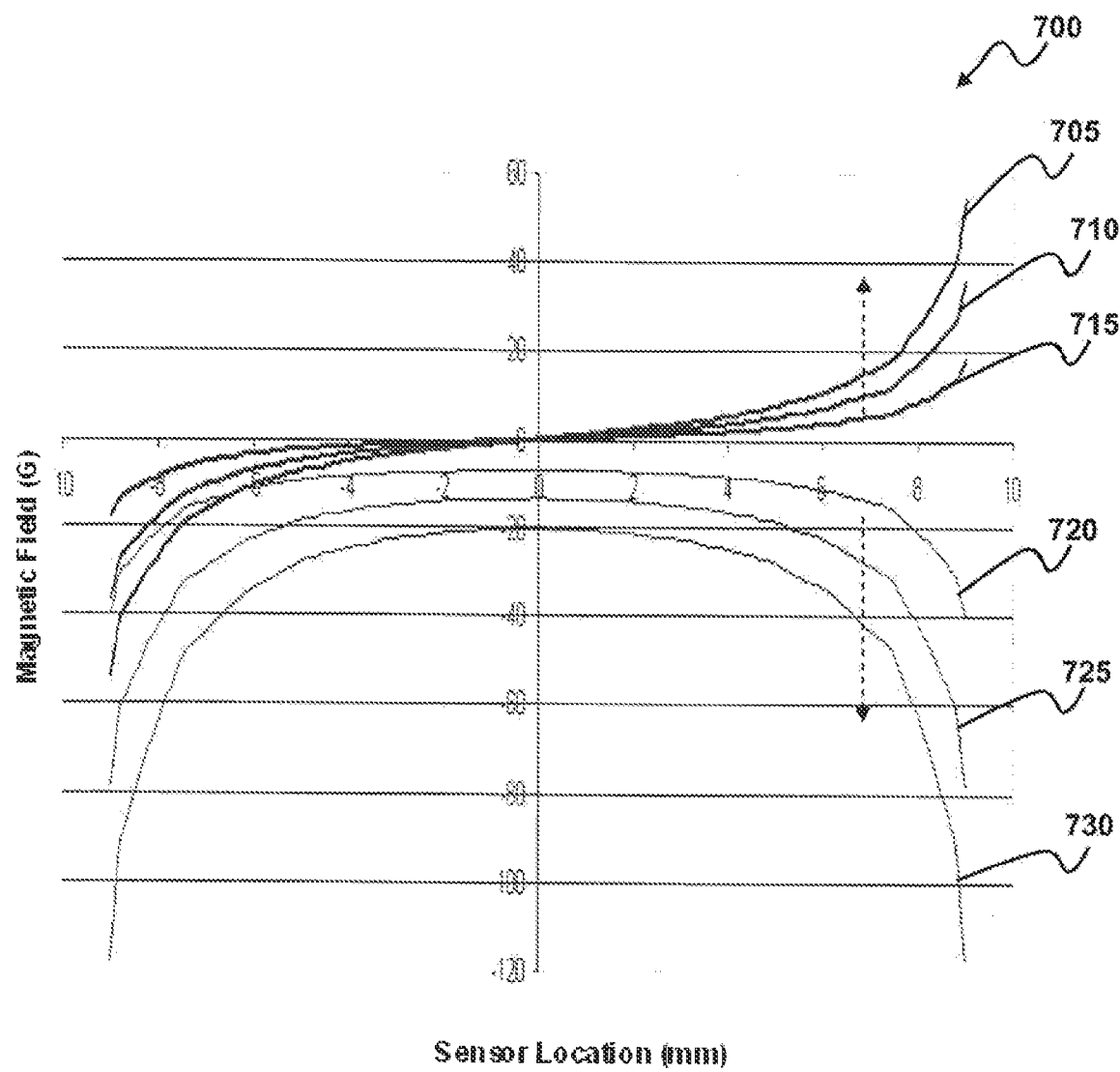
FIG. 7 illustrates a graph showing a comparison of magnetic field profile between parallel conductors with same direction currents and parallel conductors with opposite direction currents.

FIG. 7 illustrates a graph 700 showing a comparison of magnetic field profile between conductors 110 and 115 depicted in FIG. 1 with same direction currents and parallel conductors with opposite direction currents, in accordance with a preferred embodiment. The magnetic profiles 720, 725 and 730 represent the conductors carrying currents in opposite direction in core-less current sensor comprising a U-shaped conductor. The magnetic profiles 705, 710 and 715 represent the conductors carrying currents in same direction in the present invention. The downward arrow indicates the magnetic profile of core-less current sensor comprising a U-shaped conductor for increasing current and the upward arrow indicates the magnetic profile in the present invention for increasing current.

Figure 8:
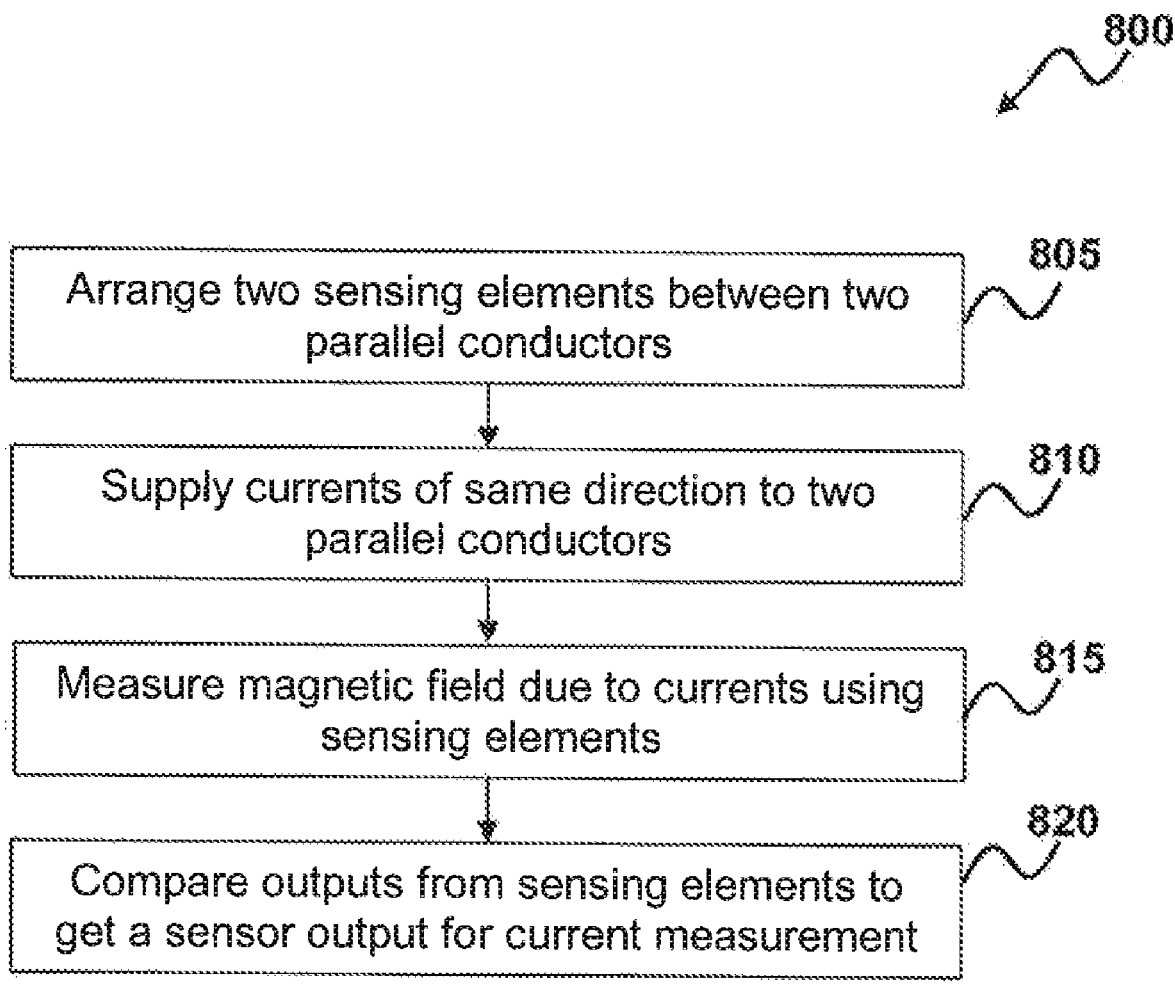
FIG. 8 illustrates a high level flow chart of operations depicting logical operational steps for measuring current through sensing elements.

FIG. 8 illustrates a high level flow chart 800 of operations depicting logical operational steps for measuring current through sensor elements, in accordance with a preferred embodiment. The sensor elements can be arranged between conductors as indicated at block 805. The current of same direction can be supplied to the conductors as indicated at block 810. Then, as depicted at block 815, the current through each conductor can be measured using the sensor elements associated with each conductor. Finally, the sensor output can be measured as difference between two sensor element outputs as said at block 820. The variations in outputs of the sensor element due to external interference get cancelled in the sensor output.

The present invention can be utilized in different applications such as for e.g. motor control, servo drives, variable speed drives, frequency converters, power supply systems, alternators, over current protection, Uninterrupted Power Supplies (UPSs) and energy meter.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A Core-less current sensor, comprising:
   two parallel current carrying conductors carrying currents in same direction;
   two magnetic field sensing elements placed in between said two conductors for sensing the magnetic field due to currents flowing through them; and
   a comparison means for comparing a first output from said first sensing element and a second output from said second sensing element wherein said first and second output varies with respect to external interference and variation in said first and second output due to external interference gets canceled in a sensor output.

2. The sensor of claim 1 wherein said sensor output is difference between said first output and said second output.

3. The sensor of claim 1 wherein said first sensing element is arranged in a point and said second sensing element is arranged between said point and said either first or second conductor wherein said point is a center point between said first conductor and said second conductor.

4. The sensor of claim 1 wherein said first sensing element is arranged between a point and said first conductor and said second sensing element is arranged between said point and said second conductor wherein said point is a center point between said first conductor and said second conductor.

5. The sensor of claim 3 wherein said point comprises zero magnetic field for all current magnitudes for equal amount of currents flowing through both conductors in same direction in absence of an external interference.

6. Sensor of claim 4 wherein sum of magnetic fields in two sensing element locations equidistant from the said point on both the sides is zero as magnetic fields at these points are equal in magnitude and opposite in polarity for all current magnitudes for equal amount of currents flowing through both conductors in same direction in absence of an external interference.

7. The invention of claim 1 wherein said coreless sensor further comprises at least one Hall Effect sensor.

8. The invention of claim 1 wherein said coreless sensor further comprises at least one magneto-resistive sensor.

9. A Core-less magneto-resistive current sensor, comprising:
   two parallel current carrying conductors adapted to carry currents in same direction;
   two magnetic field sensing elements placed in-between said two conductors and adapted for sensing the magnetic field presented by currents flowing through them; and
   a comparison means for comparing a first output from said first sensing element and a second output from said second sensing element wherein said first and second output varies with respect to external interference and variation in said first and second output are presented by external interference and get canceled in a sensor output.

10. The sensor of claim 9 wherein said sensor output is difference between said first output and said second output.

11. The sensor of claim 9 wherein said first sensing element is arranged at a center point between said first conductor and said second conductor, and said second sensing element is arranged between said center point and said either first or second conductor.

12. The sensor of claim 9 wherein said first sensing element is arranged between a center point between said first conductor and said second conductor, and said first conductor and said second sensing element are arranged between said center point and said second conductor.

13. The sensor of claim 12 wherein said center point comprises zero magnetic field for all current magnitudes for equal amount of currents flowing through both conductors in same direction in absence of an external interference, and wherein the sum of magnetic fields in two sensing element locations equidistant from the said center point on both the sides is zero as magnetic fields at these points are equal in magnitude and opposite in polarity for all current magnitudes for equal amount of currents flowing through both conductors in the same direction in absence of an external interference.

14. A method for measuring current through a pair of parallel conductors carrying current in same direction comprising:
   arranging first sensing element and second sensing element between said first conductor and said second conductor;
   supplying current of same direction to first conductor and second conductor;
   measuring current by sensing magnetic field in two different locations between said conductors using first sensing element and second sensing element; and
   comparing a first output from said first sensing element and a second output from said second sensor element wherein said first and second output varies with respect to external interference and variation in said first and second output due to external interference gets canceled in said sensor output.

15. The method of claim 14 wherein said sensor output is difference between said first output and said second output.

16. The method of claim 14 wherein said first sensing element is arranged in a point and said second sensing element is arranged between said point and said either first or second conductor wherein said point is a center point between said first conductor and said second conductor.

17. The method of claim 14 wherein said first sensing element is arranged between a point and said first conductor and said second sensing element is arranged between said point and said second conductor wherein said point is a center point between said first conductor and said second conductor.

18. The method of claim 15 where sensing elements are based on a magnetic sensing technique such as for e.g. Hall Effect, Magneto-resistive (Anisotropic Magneto-resistive, Giant Magneto-resistive etc.) sensing etc.

19. The method of claim 16 wherein said point comprises zero magnetic field for all current magnitudes for equal amount of currents flowing through both conductors in same direction in absence of an external interference.

20. The method of claim 17 wherein sum of two sensor elements output is zero as magnetic field is equal in magnitude and opposite in polarity for all current magnitudes for equal amount of currents flowing through both conductors in same direction in absence of an external interference.

* * * * *